(12) United States Patent
Reingruber et al.

(10) Patent No.: US 9,741,651 B1
(45) Date of Patent: Aug. 22, 2017

(54) REDISTRIBUTION LAYER LINES

(71) Applicant: Intel IP Corporation, Santa Clara, CA (US)

(72) Inventors: Klaus Reingruber, Langquaid (DE); Sven Albers, Regensburg (DE); Christian Geissler, Teugn (DE)

(73) Assignee: Intel IP Corportaion, Santa Clara, CA (US)

( * ) Notice: Subject to any disclaimer, the term of this patent is extended or adjusted under 35 U.S.C. 154(b) by 0 days.

(21) Appl. No.: 15/052,505

(22) Filed: Feb. 24, 2016

(51) Int. Cl.
*H01F 5/00* (2006.01)
*H01L 23/498* (2006.01)
*H01L 21/48* (2006.01)

(52) U.S. Cl.
CPC .... *H01L 23/49838* (2013.01); *H01L 21/4846* (2013.01)

(58) Field of Classification Search
CPC ........... H01L 23/53238; H01L 21/7685; H01L 21/76826; H01L 21/76832; H01L 21/76846; H01L 23/528; H01L 23/5226; H01L 23/5256; H01L 23/53295
See application file for complete search history.

(56) References Cited

U.S. PATENT DOCUMENTS

| 6,455,408 B1 | 9/2002 | Hwang et al. |
| 2005/0266667 A1 | 12/2005 | Huang |
| 2009/0283903 A1 | 11/2009 | Park |
| 2013/0316527 A1 | 11/2013 | Cardwell |
| 2015/0228594 A1 | 8/2015 | Alvarado et al. |

OTHER PUBLICATIONS

International Search Report and Written Opinion dated Apr. 28, 2017 for International Application No. PCT/US2017/014606, 12 pages.

*Primary Examiner* — Roy Potter
(74) *Attorney, Agent, or Firm* — Schwabe, Williamson & Wyatt, P.C.

(57) ABSTRACT

Embodiments herein may relate to a package with a dielectric layer having a first face and a second face opposite the first face. A conductive line of a patterned metal redistribution layer (RDL) may be coupled with the second face of the dielectric layer. The line may include a first portion with a first width and a second portion directly coupled to the first portion, the second portion having a second width. The first portion may extend beyond a plane of the second face of the dielectric layer, and the second portion may be positioned between the first face and the second face of the dielectric layer. Other embodiments may be described and/or claimed.

18 Claims, 11 Drawing Sheets

REDISTRIBUTION LAYER LINES

TECHNICAL FIELD

The present disclosure relates generally to the conductive lines in a package, and more specifically to conductive lines of a redistribution layer (RDL) or silicon wafer technology.

BACKGROUND

In an electronic package or module, internal electrical connections or electrical connections towards a printed circuit board (PCB) may be used. These electrical connections may be realized in flip chip ball grid array (fcBGA) packages by metal layers in a substrate. Alternatively, the connections may be realized in wafer level packages like an embedded wafer level BGA (eWLB) or a wafer level chip scale package (WLCSP) by a patterned redistribution layer (RDL). Generally, a single metal portion of an RDL may be referred to herein as a "line."

In legacy packages, a line of an RDL may have a typically rectangular cross section. The cross sectional area of the line may serve to define the ohmic resistance experienced by current flowing through the line.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
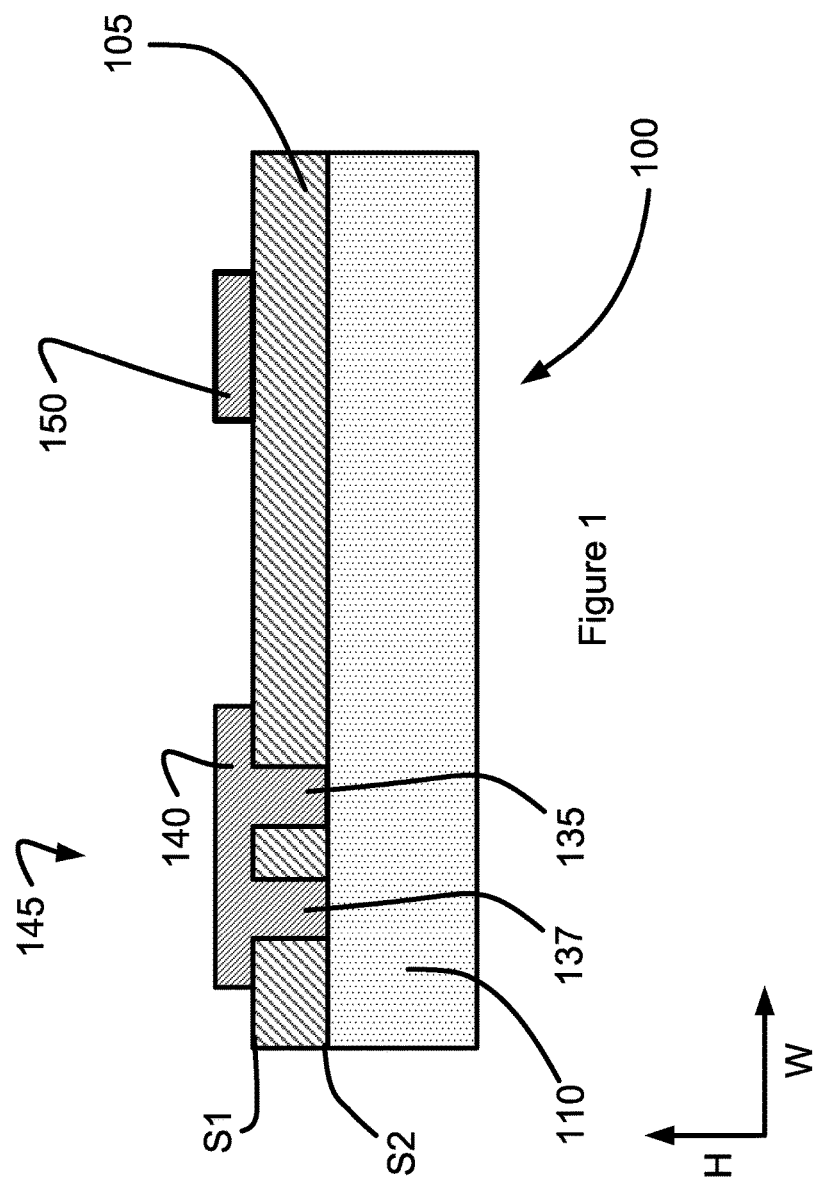
FIG. 1 depicts a package with an RDL, in accordance with various embodiments.

Embodiments herein may relate to a package with a dielectric layer coupled with a conductive line of a patterned metal redistribution layer (RDL). The line may include a first portion with a first width and a second portion directly coupled to the first portion, the second portion having a second width. The first portion may extend beyond a plane of the second face of the dielectric layer, and the second portion may be positioned between the first face and the second face of the dielectric layer. Other embodiments may be described and/or claimed.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As discussed above, a package such as an fcBGA package, an eWLB package, a WLCSP package, or some other package may include an RDL that may include one or more metal lines. Typically, the RDL may be positioned between an integrated circuit (IC) component such as a die and a layer of the package or a PCB. The IC component may have a plurality of contacts that are positioned relatively closely to one another. Specifically, the distance from one side of a first contact to the same side of a second contact may be referred to as pitch, and the pitch of the IC component may be referred to as a chip-scale pitch. However, the other layer of the package or the PCB may have a larger pitch, which in some embodiments may be referred to as a wafer-level pitch or package-level pitch. Generally, embodiments herein will be described with respect to an RDL that serves to couple contacts at the chip-scale pitch to contacts at the wafer-level pitch. However, in other embodiments the RDL may couple one or more pitches at one or more different scales.

As mentioned above, individual metal portions of the RDL may be referred to as lines. In other embodiments, the lines may be referred to as "traces." Generally, the lines may serve to transfer electrical signals from one contact of the package to another. Such signals may include data signals or power/ground signals. Generally, the lines may be conductive metal such as copper, aluminum, gold, nickel, molybdenum, alloys thereof, combinations thereof, or some other conductive metal.

As noted above, the lines in legacy packages may have a generally rectangular cross section, the area of which may define the ohmic resistance experienced by current flowing through the line. Generally, if the cross section is increased, ohmic resistance through the line may be decreased and the current flowing through the line may increase. In many embodiments it may be desirable to therefore have a larger cross section; however, increasing the cross section may be difficult because the way to do so in legacy packages may be to either increase the z-height of the line, or increase the lateral area of the line. However, in many legacy packages, it may be undesirable to increase the z-height and/or the lateral area of the line because doing so may ultimately make the package larger in one or more directions, which may be undesirable because devices that use such a package are becoming smaller.

Embodiments herein may include packages that have one or more lines with an increased cross section that may not increase the z-height or the lateral area of the line. Specifically, FIG. 1 depicts a package 100. The package 100 may include a substrate 110 which may be a mold compound, a fiber core material, a prepreg material, a dielectric material, or some other substrate material. A dielectric layer 105 may be coupled with the substrate 110. The dielectric material of the dielectric layer 105 may be Polybenzoxazole (PBO), polyiomide (PI), or some other dielectric material. The dielectric layer 105 may have a face S2 coupled with the substrate 110, and a face S1 that is opposite face S2. The dielectric layer 105 may further include an additional line or a pad such as pad 150 deposited on the face S1.

A line 145 may be deposited on and within the dielectric layer 105. Specifically, the line 145 may include a first portion 140 that extends from the face S1 of the dielectric layer 105. The line 145 may include a second portion 135 that is generally positioned within the dielectric layer 105. Although the first portion 140 and the second portion 135 are referred to herein as different portions, in embodiments the line 145 may be a unitary physical element such that the first and second portions 140 and 135 are not separable. In other embodiments, the two portions 140 and 135 may be comprised of different materials and/or may be separable. Additionally, although the second portion 135 is depicted as extending through the dielectric layer 105 such that it contacts the substrate 110, in other embodiments the second portion 135 may only partially extend from the face S1 through the dielectric layer 105.

As depicted in FIG. 1, the line 145 may further include a third portion 137 that may be adjacent to the second portion. As described above, although the first portion 140 and the third portion 137 are referred to herein as different portions, in embodiments the line 145 may be a unitary physical element such that the first and third portions 140 and 137 are not separable. In other embodiments, the two portions 140 and 137 may be comprised of different materials and/or may be separable. Additionally, although the third portion 137 is depicted as extending through the dielectric layer 105 such that it contacts the substrate 110, in other embodiments the third portion 137 may only partially extend from the face S1 through the dielectric layer 105. In some embodiments, the second portion 135 and the third portion 137 may have a same size as one another, for example, a same width as measured parallel to the face S1 or a same z-height as measured perpendicular to face S1. In other embodiments the second portion 135 and the third portion 137 may have a different width and/or z-height from each other. In some embodiments the width of the first portion 140 may be larger than the width of the second portion 135 and/or the third portion 137.

As used with respect to FIG. 1, width may refer to a distance from the left side of the figure to the right side of the figure (or vice versa). In FIG. 1, width is marked with an axis labeled "W." Generally, the line 145 may further include a length (as will be discussed in further detail below). The length of the line 145 may generally be measured parallel to the face S1 and perpendicular to the width measurement. As depicted in FIG. 1, the length of the line 145 may be measured as going into or out of the page of FIG. 1. As noted above, the z-height of the line 145 may be measured in a direction perpendicular to the face S1 of dielectric layer 105. In FIG. 1, z-height is marked with an axis labeled "H."

Although a second portion 135 and a third portion 137 are depicted in FIG. 1, other embodiments may include additional portions adjacent to the second and/or third portions 135 and 137, or may only include the second portion 135 or third portion 137.

As can be seen, the inclusion of at least the second or third portions 135 or 137 may increase the cross sectional area of the line 145. As noted above, such an increase in cross sectional area may reduce the ohmic resistance of the line 145, and increase the amount of current that can flow through the line 145. Notably, by including the second and/or third portions 135 and/or 137, such a decrease in resistance and increase in current flow can be done without increasing the overall z-height or lateral area of the line 145.

In one example embodiment, the dielectric layer 105 may have a z-height of approximately 8 microns. The portions 137 and 135 may have a width of approximately 8 microns each. In some embodiments, the portions 137 and 135 may be spaced approximately 8 microns away from each other. In some embodiments, the z-height of the portion 140 may be approximately 4 microns. The overall width of the first portion 140 may be approximately 30 microns. Other embodiments may have different z-heights and/or widths. Further discussion of height and width measurements may be provided with respect to FIGS. 7a-7c, below.

Figure 2:
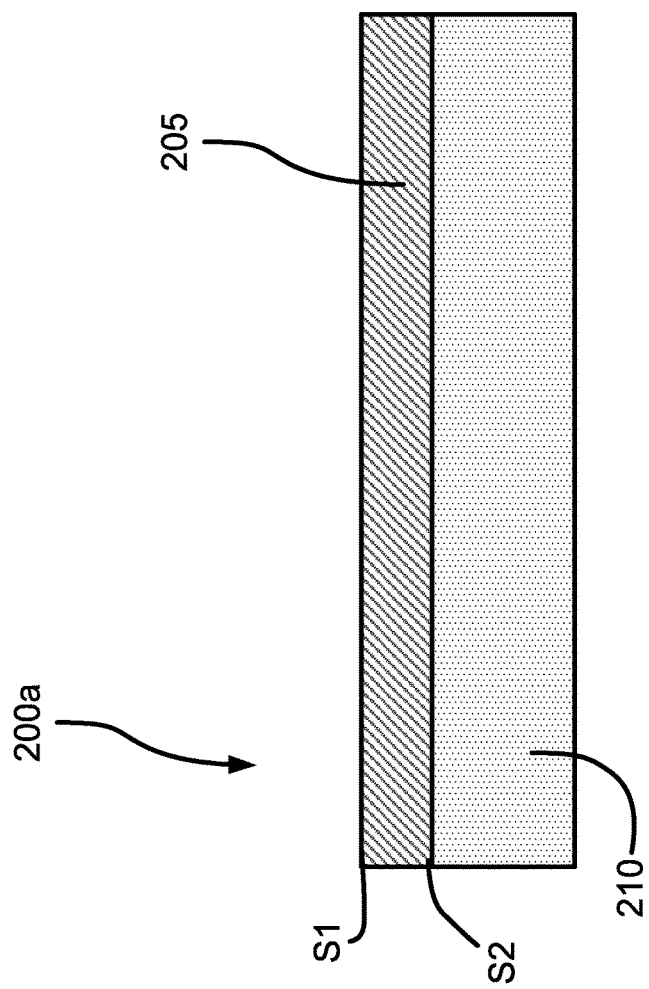
FIG. 2 depicts a stage of manufacture of a package with an RDL, in accordance with various embodiments.

FIG. 2-5 depict stages of manufacture of a package with an RDL such as package 100. Specifically, FIG. 2 depicts package 200a that may include a substrate 210 and a dielectric layer 205, which may be respectively similar to substrate 110 and dielectric layer 105. As discussed above, the dielectric layer 205 may have a face S1 and a face S2 that is opposite S1 and coupled with the substrate 210.

Figure 3:
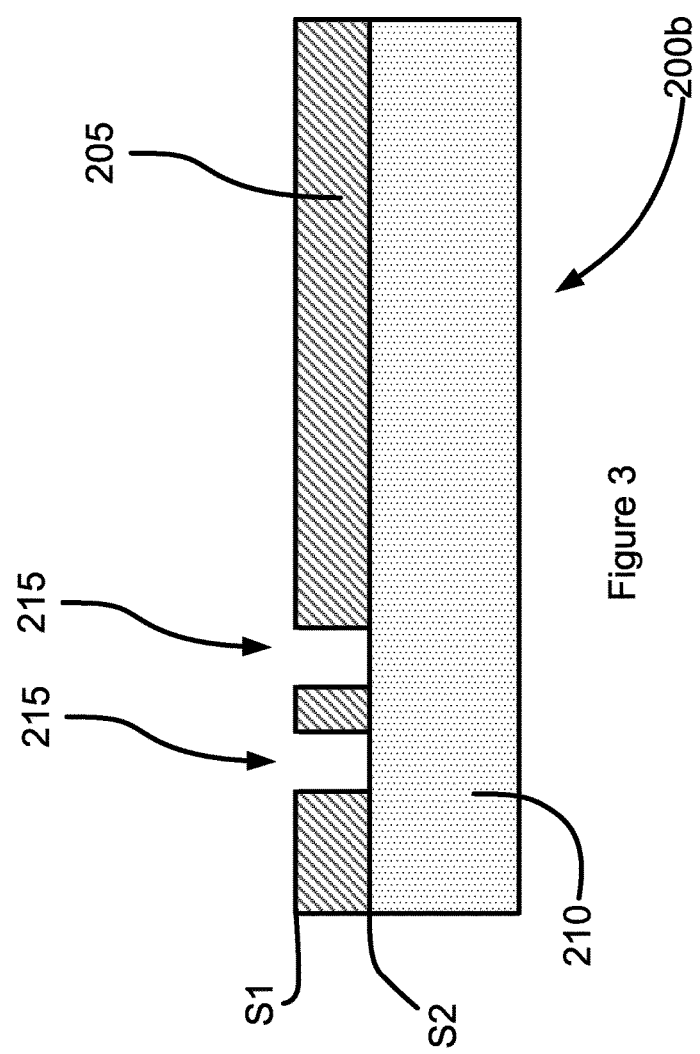
FIG. 3 depicts another stage of manufacture of a package with an RDL, in accordance with various embodiments.

As shown in FIG. 3 with respect to package 200b, one or more trenches such as trenches 215 may be formed in face S1 of the dielectric layer 205. Specifically, the trenches 215 may be formed through a process such as a photolithographic process, a chemical or physical etching process, a mechanical or optical drilling process, or some other process. In embodiments, the trenches 215 may extend through the entirety of the dielectric layer 205 such that the substrate 210 is exposed. In other embodiments, the trenches 215 may only extend through a portion of the dielectric layer 205 such that the substrate 210 is not exposed. Although two trenches 215 are depicted in FIG. 3, in other embodiments there may be more or fewer trenches. In some embodiments, the trenches 215 may be at different depths than one another.

Figure 4:
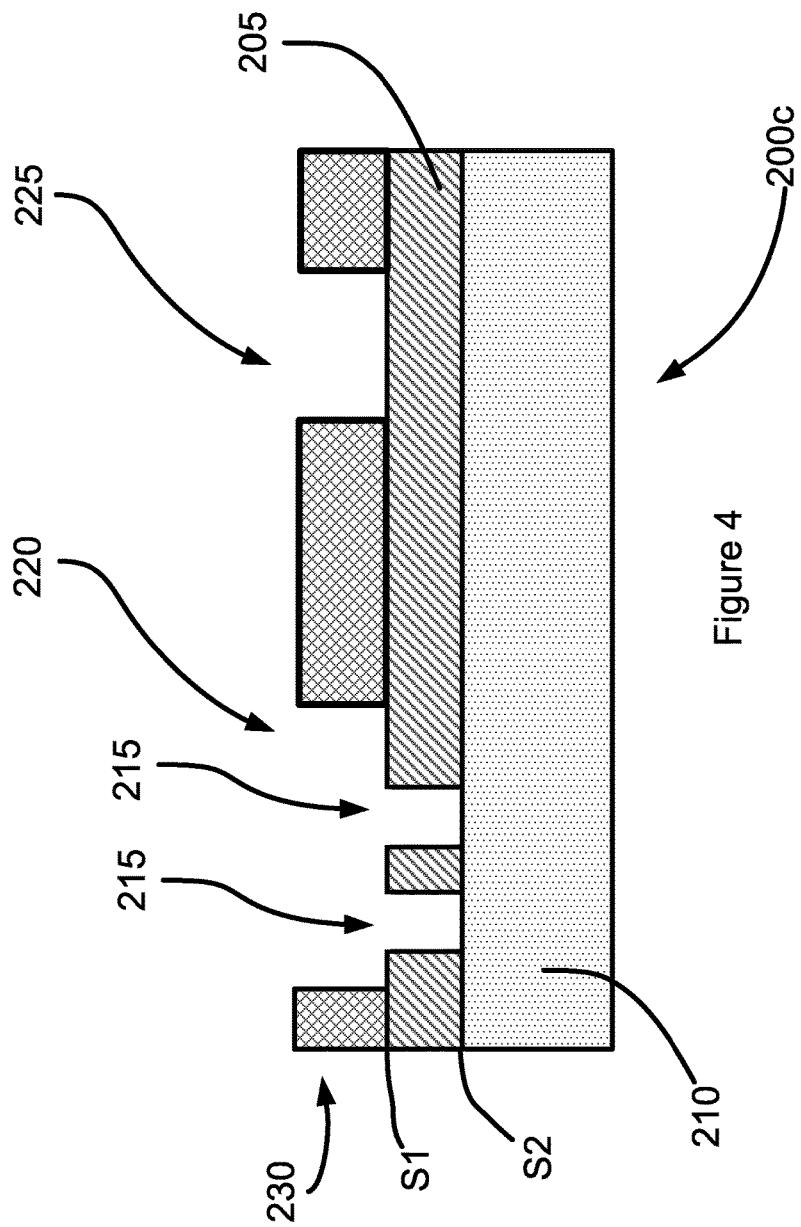
FIG. 4 depicts another stage of manufacture of a package with an RDL, in accordance with various embodiments.

As shown in FIG. 4 with respect to package 200c, a plating resist layer 230 may then be provided on face S1 of dielectric layer 205. In embodiments, the plating resist layer 230 may be provided by deposition, lamination, inkjet printing, stenciling, or some other process. As shown in FIG. 4, the plating resist layer 230 may include a cutout 225 for a pad such as pad 150. The plating resist layer 230 may further include a cutout 220 for a line such as line 145.

As discussed above, the cutout 220 may have a width greater than the width of the trenches 215. This increased width may be to allow for the beneficial increased cross section of the resultant line, as described above. In some embodiments, the cutout 220 may have a same width as one of the trenches 215, two of the trenches 215 combined, or some other width.

Figure 5:
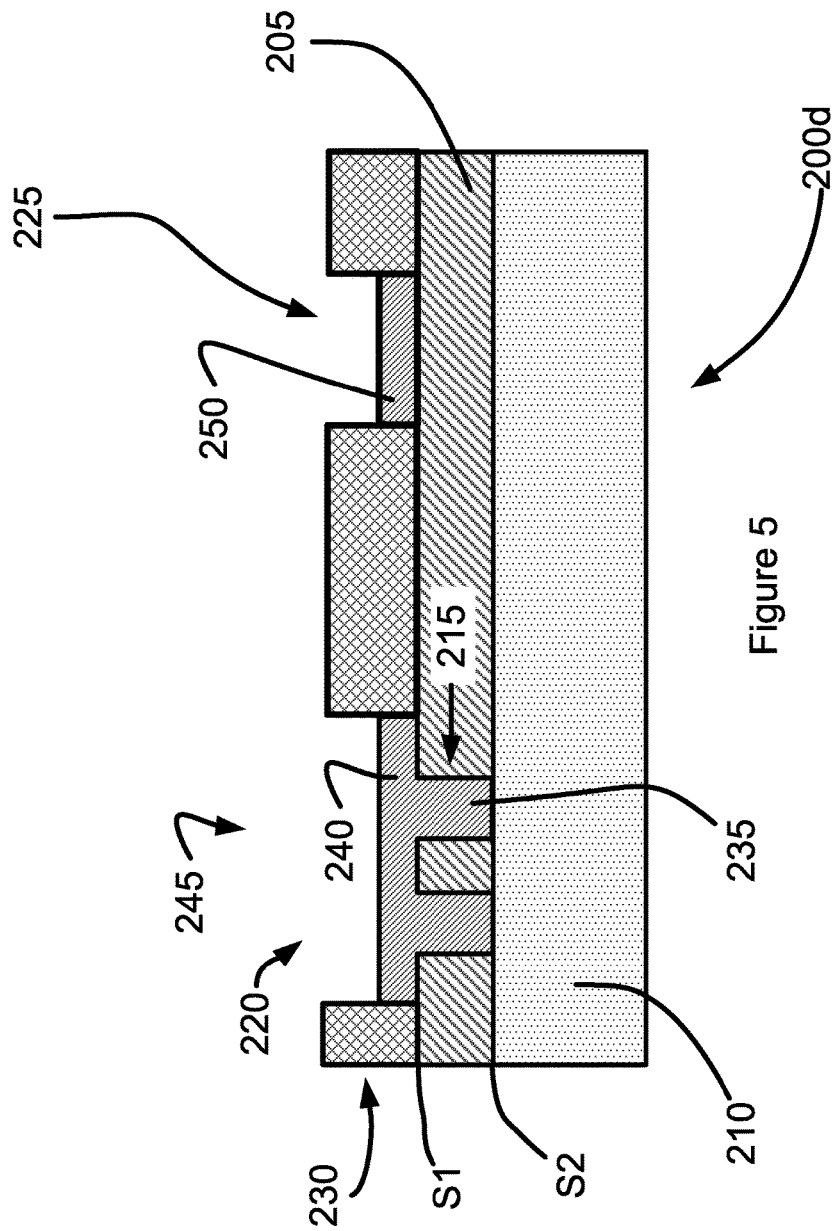
FIG. 5 depicts another stage of manufacture of a package with an RDL, in accordance with various embodiments.

As shown in FIG. 5 with respect to package 200d, a line 245, which may be similar to line 145, may be formed in cutout 220 and trenches 215. Similarly, a pad 250, which may be similar to pad 150, may be formed in cutout 225. In embodiments, the line 245 may include a first portion 240 and at least a second portion 235, which may be respectively similar to first portion 140 and second portion 135.

In embodiments, forming the line 245 and/or pad 250 may include a plating step wherein the material of the line 245 and/or pad 250, for example, copper or some other conductive material, may be plated onto package 200c to form package 200d. The plating process will be described in greater detail below. In some embodiments, forming the line 245 and/or pad 250 may additionally or alternatively include a planarising deposition process such as physical vapor deposition (PVD) and/or electrochemical deposition (ECD). The use of such a planarising process may be beneficial because such a process may provide for a line 245 with a significantly or completely filled first portion 240 and second portion 235. Without such a planarising process, the first portion 240 may have a divot or trench such that the line 245 may not enjoy the benefit of the increased cross-sectional area provided by the first portion 240 and second portion 235. In other embodiments, some other form of providing the line 245 and/or pad 250, for example, sputtering, lamination, or some other process, may be used in addition to or as an alternative to the processes described above. A package similar to package 100 may then be formed by removing the plating resist layer 230 (and the seed layer if necessary).

In some embodiments, not shown, a seed layer may be deposited on package 200b prior to forming the plating resist layer 230. Such a seed layer may be useful to enhance the formation of the line 245 and/or pad 250.

Figure 6:
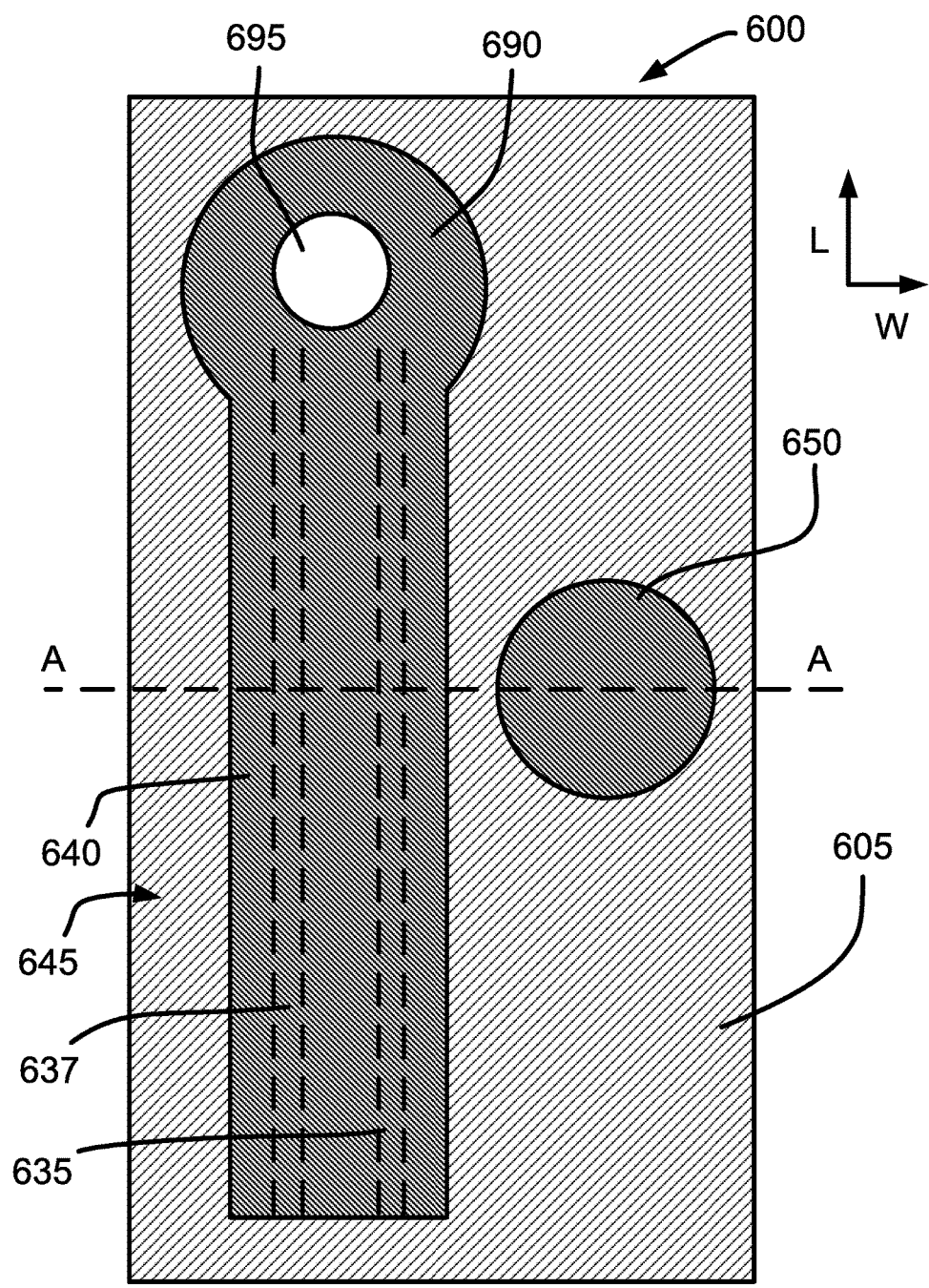
FIG. 6 depicts a top-down view of a package with an RDL, in accordance with various embodiments.

FIG. 6 depicts an example top-down view of a package 600 which may be similar to package 100. Specifically, package 600 may include a dielectric layer 605, a pad 650, and a line 645 with portions 640, 637, and 635, which may be respectively similar to dielectric layer 105, pad 150, line 145, and portions 140, 137, and 135. Generally, FIG. 1 may be considered to be a cut-away view of package 600 taken along line "A-A" as shown in FIG. 6.

In some embodiments, the line 645 may be coupled with a pad 690, which may be similar to pad 650. Pad 690 may include a via such as via 695. Generally, the via 695 may be for electrically and/or thermally coupling pad 690 (and thereby line 645) with another line or another contact in a different layer of the package 600. For example, the via 695 may electrically couple the pad 690 with a contact of a substrate such as substrate 110, or a layer positioned above the dielectric layer 605. In some embodiments, the via 695 may have a diameter of approximately 10 to 30 microns. The pad 690 may have a diameter of approximately 30 to 60 microns. Although the pad 690 and via 695 are depicted as generally circular, in other embodiments the pad 690 and/or via 695 may have a different shape, such as square, triangular, etc.

Similarly to FIG. 1, FIG. 6 may include an axis for width labeled "W" which may be similar to the axis labeled "W" of FIG. 1. As noted with respect to FIG. 1, the line 645 may further include a length measured parallel to the face S1 and perpendicular to the width measurement. In FIG. 6, the length axis is labeled "L." As noted above, the line 645 may further include a z-height that may be measured as going into or out of the page of FIG. 6. In some embodiments, the line 645 may have a length of approximately a few microns to a few millimeters (mm).

As noted above, in some embodiments portions 635 and 637 may have a same width as one another, as shown in FIG. 6, while in other embodiments the portions 635 and 637 may wholly or partially have a different width than one another.

Figure 7A:
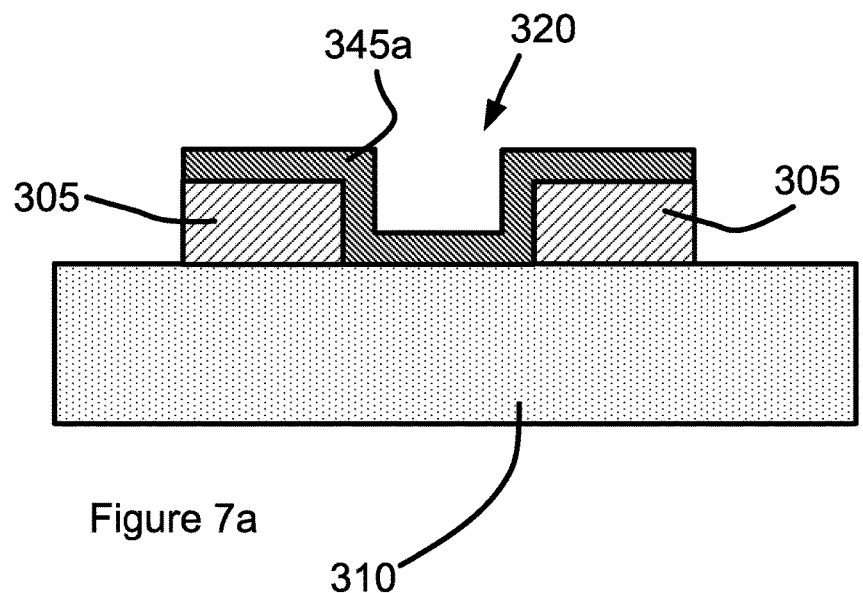
FIGS. 7a-7c depict an example technique for plating a line of an RDL, in accordance with various embodiments.
Figure 7B:
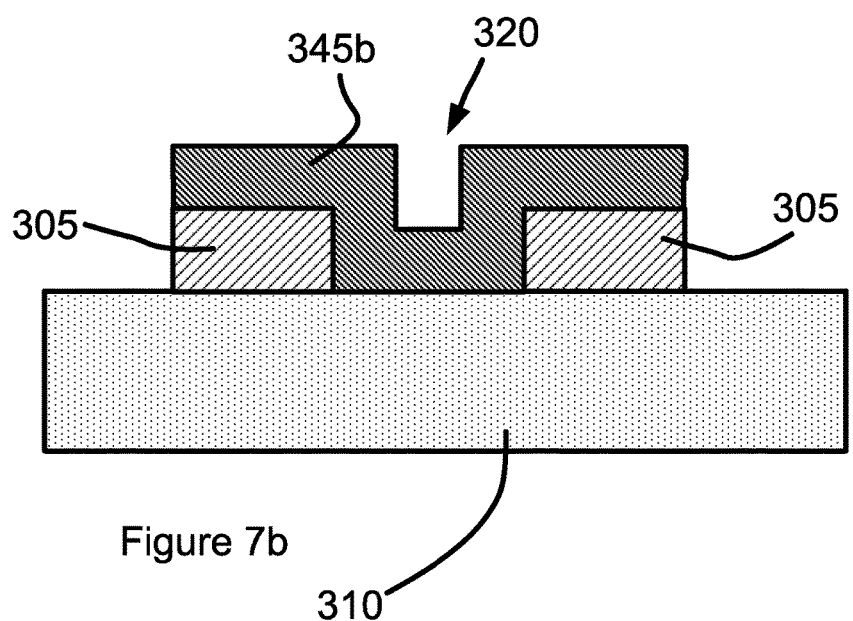
Figure 7C:
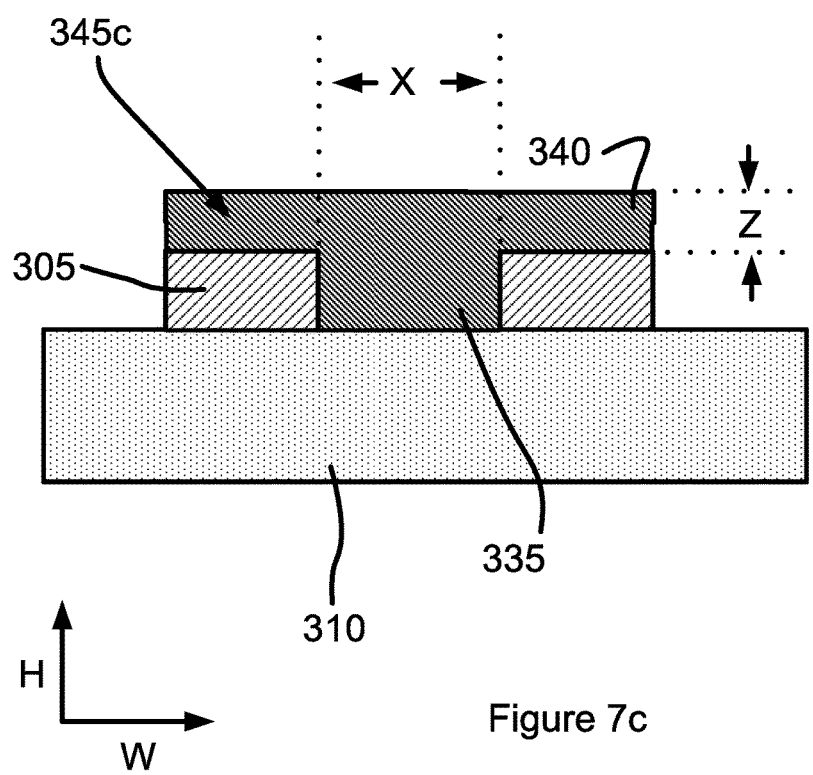

FIGS. 7a through 7c depict various stages of manufacturing a line 345c, which may be similar to lines 145 or 245. Specifically, as noted above the process of manufacturing may include a plating and/or planarising deposition process such as PVD and/or ECD. In embodiments, the process may include one or more sequential planar platings or depositions such that the line is built up. For example, FIG. 7a depicts a substrate 310 and dielectric layer 305 with a cutout 320 which may be respectively similar to substrate 210, dielectric layer 205, and cutout 220. Initially line 345a may be formed on the dielectric layer 305 and within the cutout 320 via the plating and/or planarising deposition process. Next, as shown in FIG. 7b, the line 345b may be further built up via another application of the plating and/or planarising deposition process. As shown in FIG. 7c, the line 345c may then be fully formed via another application of the plating and/or planarising deposition process.

As depicted in FIG. 7c, the relative dimensions of the line 345c may be chosen such that the plating and/or planarising deposition process efficiently generates the line 345c without creating voids or divots in a top portion of the line 345c. Specifically, the line 345c may have portions 340 and 335, which may be respectively similar to portions 140 and 135. The portion 335 may have a width denoted by "X" in FIG. 7c. Additionally portion 340 may have a z-height denoted by "Z" in FIG. 7c. The width and height may be with respect to axes H and W, which may be similar to axes H and W of FIG. 1.

In embodiments, the width X of the portion 335 may be less than twice the z-height Z of portion 340. In some embodiments, the width X may be only slightly less than twice the z-height Z of portion 340. As depicted in FIGS. 7a-7c, the plating and/or planarising deposition process may deposit relatively even layers of the conductive line material (e.g., copper) on the dielectric layer 305 and/or the substrate 310. By setting the dimensions of X and Z as described above, the plating and/or planarising deposition process may substantially fill the cutout 320 and form line 345c without leaving voids or divots.

In some embodiments, the z-height Z and width X may be dependent on the aspect ratio of the plating and/or planarising deposition process. In some embodiments, the plating and/or planarising deposition process may be tuned such that the horizontal deposition rate is different than the vertical deposition rate. In these embodiments, the width X of portion 335 may be higher or lower than twice the z-height Z of portion 340.

The above described example depicted in FIGS. 7a-7c is only intended as one example, and in other embodiments the relative dimensions of X and Z may be different than described above. In some embodiments, the line 345c may include more than one portion 335 adjacent to dielectric layer 305. In embodiments, the plating and/or planarising deposition process may include more iterations or fewer iterations than described with respect to FIGS. 7a-7c.

Figure 8:
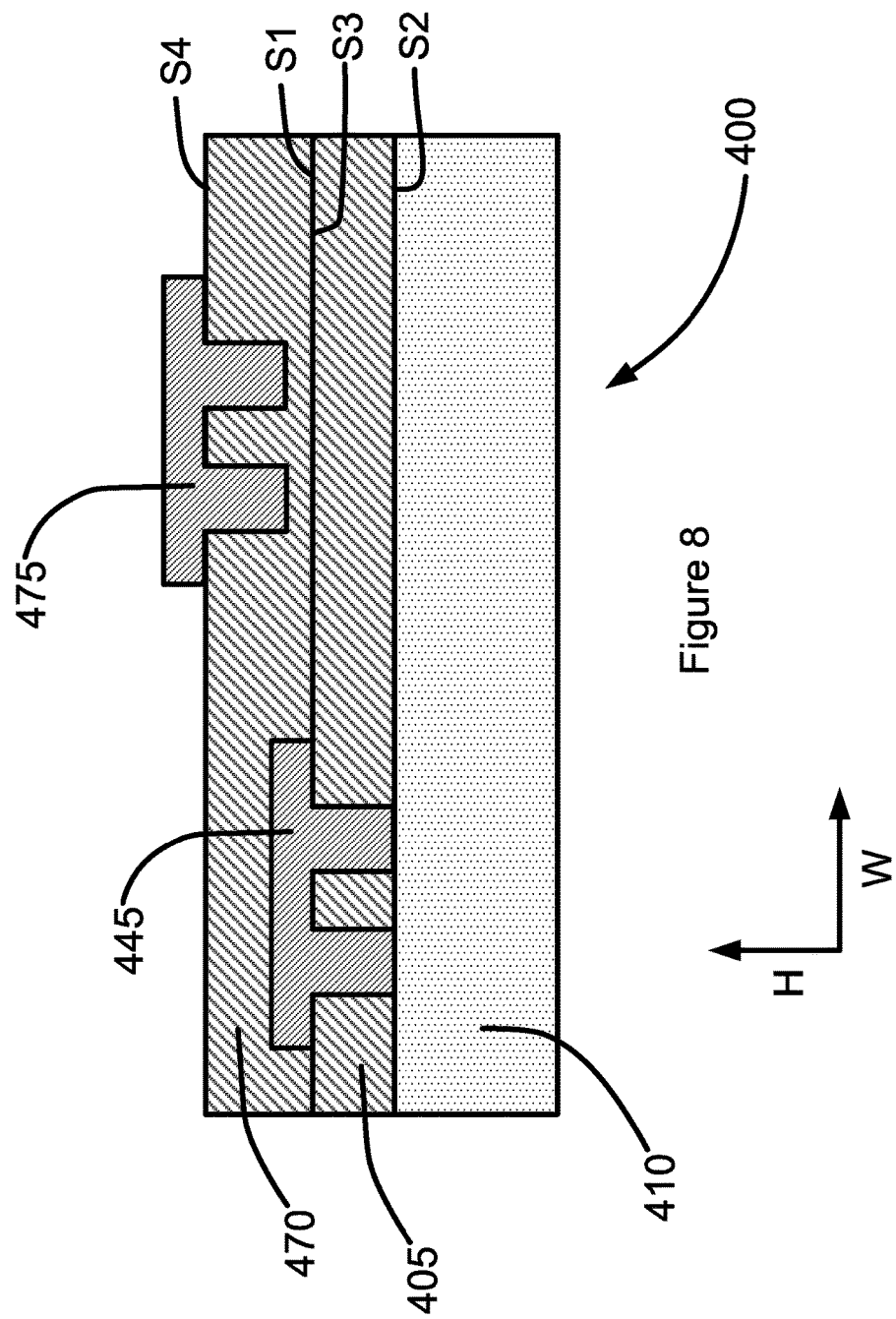
FIG. 8 depicts another example of a package with a multi-layer RDL, in accordance with various embodiments.

FIG. 8 depicts an alternative example of a package 400 with multiple lines of an RDL. Specifically, the package 400 may include a substrate 410, a dielectric layer 405, and a line 445 which may be respectively similar to substrate 110, dielectric layer 105, and line 145. The dielectric layer 405 may include sides S1 and S2. Side S2 may be coupled with the substrate 410.

The package 400 may further include an additional dielectric layer 470, which may be similar to dielectric layer 405. The dielectric layer 470 may have opposite sides S3 and S4. Side S3 may be coupled with side S1 of dielectric layer 405. The package 400 may include a line 475, which may be similar to line 445, in and on side S4 of dielectric layer 470. Additional dielectric layers and lines may be present in and on package 400 in other embodiments. In some embodiments, one or more alternative layers may be present between dielectric layers 405 and 470.

Figure 9:
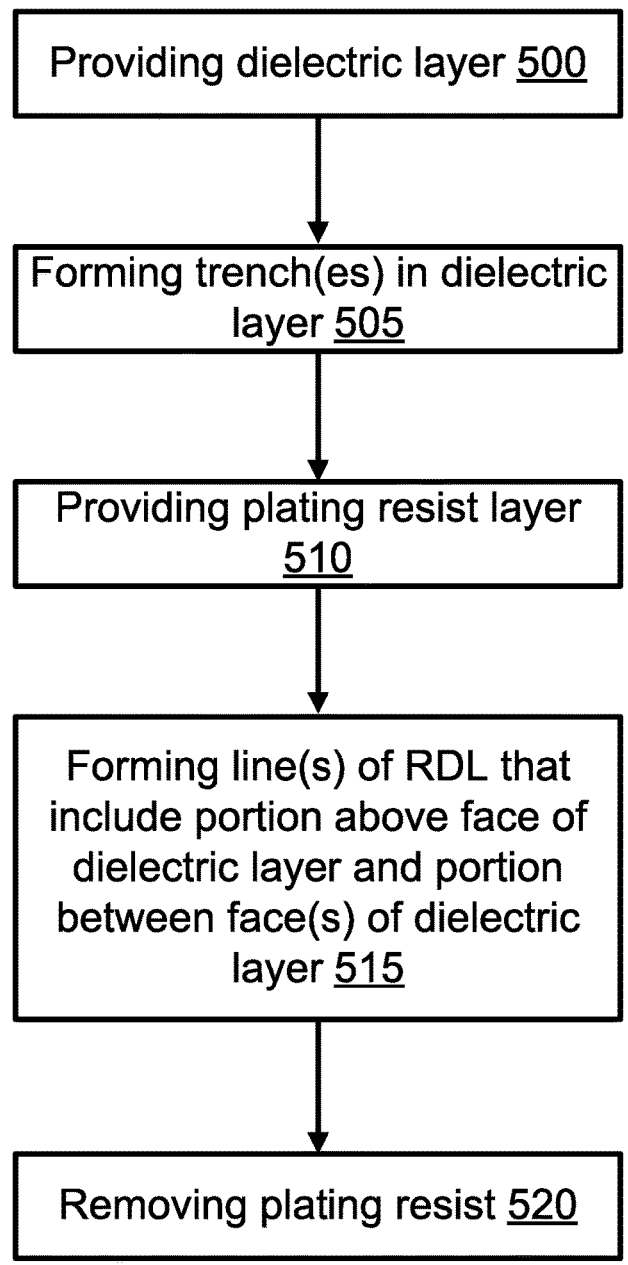
FIG. 9 depicts an example process flow for manufacturing a package with an RDL, in accordance with various embodiments.

FIG. 9 depicts an example process for generating a package such as package 100. Initially, a dielectric layer may be provided. In some embodiments, the dielectric layer may be similar to dielectric layer 205 and provided on a substrate such as substrate 210 at 500. In some embodiments, the dielectric layer may be similar to dielectric layer 470 and provided on dielectric layer 405 and/or line 445.

Next, one or more trenches such as trenches 215 may be formed in the dielectric layer 205 at 505. As noted above, the one or more trenches may be formed through a process such as a photolithographic process, a chemical or physical etching process, a mechanical or optical drilling process, or some other process.

A plating resist layer such as plating resist layer 230 may then be provided at 510. As noted above, the plating resist layer may be provided by deposition, lamination, inkjet printing, stenciling, or some other process.

One or more lines of an RDL may then be formed at 515. In embodiments, the one or more lines of the RDL may be similar to line 245 and may include a portion such as portion 240 that is above a face of a dielectric layer such as face S1 of dielectric layer 205, and a portion such as portion 235 that is between the faces of a dielectric layer such as faces S1 and S2 of dielectric layer 205. In embodiments, the one or more lines may be formed at 515 via a plating and/or planarising deposition process as described above.

The plating resist layer may then be removed at 520 to generate a package such as package 100. As noted above, in some embodiments the process may include deposition of a seed layer, for example, between elements 505 and 510, and removal of the seed layer, for example, subsequent to element 520. In some embodiments, the process may be repeated to form a package such as package 400.

Figure 10:
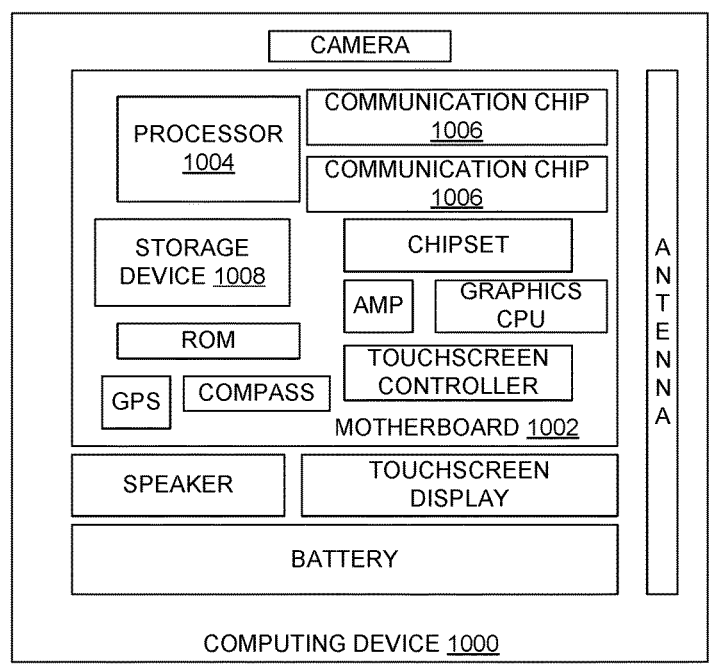
FIG. 10 is an example computing device that may include a package with an RDL, in accordance with various embodiments.

Embodiments of the present disclosure may be implemented into a system using any packages that may benefit from the various manufacturing techniques disclosed herein. FIG. 10 schematically illustrates a computing device 1000, in accordance with some implementations, which may include one or more packages such as packages 100, 400, or some other package herein. For example, various elements such as processor 1004, communication chip 1006, and/or some other component of the computing device 1000 may be coupled with motherboard 1002 by way of the above-described packages.

The computing device 1000 may be, for example, a mobile communication device or a desktop or rack-based computing device. The computing device 1000 may house a board such as a motherboard 1002. The motherboard 1002 may include a number of components, including (but not limited to) a processor 1004 and at least one communication chip 1006. Any of the components discussed herein with reference to the computing device 1000 may be arranged in or coupled with a package such as discussed herein. In further implementations, the communication chip 1006 may be part of the processor 1004.

The computing device 1000 may include a storage device 1008. In some embodiments, the storage device 1008 may include one or more solid state drives. Examples of storage devices that may be included in the storage device 1008 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 1000 may include other components that may or may not be physically and electrically coupled to the motherboard 1002. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

The communication chip 1006 and the antenna may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide region (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1006 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1006 may operate in accordance with other wireless protocols in other embodiments.

The computing device 1000 may include a plurality of communication chips 1006. For instance, a first communication chip 1006 may be dedicated to shorter range wireless communications such as Wi-Fi and Bluetooth, and a second communication chip 1006 may be dedicated to longer range wireless communications such as GPS, EDGE, GPRS, CDMA, WiMAX, LTE, EV-DO, and others. In some embodiments, the communication chip 1006 may support wired communications. For example, the computing device 1000 may include one or more wired servers.

The processor 1004 and/or the communication chip 1006 of the computing device 1000 may include one or more dies or other components in an IC package. Such an IC package may be coupled with an interposer or another package using any of the techniques disclosed herein. The term "processor" may refer to any device or portion of a device that processes electronic data from registers and/or memory to transform that electronic data into other electronic data that may be stored in registers and/or memory.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data. In some embodiments, the recessed conductive contacts disclosed herein may be implemented in a high-performance computing device.

The following paragraphs provide examples of various ones of the embodiments disclosed herein.

Example 1 may include a package comprising: a dielectric layer having a first face and a second face opposite the first face; and a conductive line of a patterned metal redistribution layer (RDL) coupled with the second face of the dielectric layer, the line including a first portion with a first width as measured in a first direction parallel to the second face and a second portion directly coupled to the first portion, the second portion having a second width as measured in the first direction; wherein the first portion extends beyond a plane of the second face of the dielectric layer in a second direction perpendicular to the second face and the second portion is positioned between the first face and the second face of the dielectric layer; and wherein the line is to carry one or more signals in a third direction perpendicular to the first and second directions.

Example 2 may include the package of example 1, wherein the package is a flip chip ball grid array (fcBGA) package.

Example 3 may include the package of example 1, wherein the package is an embedded wafer level ball grid array (eWLB) package.

Example 4 may include the package of example 1, wherein the package is a wafer level chip scale package (WLCSP).

Example 5 may include the package of any of examples 1-4, wherein the line is to carry one or more power or data signals.

Example 6 may include the package of any of examples 1-4, wherein the RDL is to expand a chip-scale pitch at a first side of the package to a package-scale pitch at a second side of the package.

Example 7 may include the package of any of examples 1-4, wherein the width of the second portion is less than the width of the first portion.

Example 8 may include the package of example 7, wherein the first portion has a z-height measured in the second direction, and the width of the second portion is less than twice the z-height of the first portion.

Example 9 may include the package of any of examples 1-4, wherein the line further includes a third portion that is directly coupled to the first portion and adjacent to the second portion.

Example 10 may include the package of any of examples 1-4, wherein the second portion is to reduce ohmic resistance of the line.

Example 11 may include the package of any of examples 1-4, wherein the dielectric layer is a first dielectric layer, the line is a first line, and the RDL is a first RDL, and further comprising: a second dielectric layer having a first face and a second face opposite the first face, wherein the first face of the second dielectric layer is coupled with the second face of the first dielectric layer; and a second line of a second RDL coupled with the second face of the second dielectric layer, the second line including a third portion and a fourth portion, wherein the third portion extends beyond a plane of the second face of the second dielectric layer in the second direction and the fourth portion is positioned between the first face of the second dielectric layer and the second face of the second dielectric layer.

Example 12 may include a method comprising: providing, on a package, a dielectric layer having a first face and a second face opposite the first face; forming, in the second face of the dielectric layer, one or more trenches; and forming, on the second face of the dielectric layer and in at least one of the one or more trenches, a conductive line of a redistribution layer (RDL), the line including a second portion in the at least one of the one or more trenches and a first portion on the second face of the dielectric layer; wherein the first portion has a first length as measured in a first direction parallel to the second face of the dielectric layer and a first width as measured in a second direction parallel to the second face of the dielectric layer and perpendicular to the first direction; wherein the second portion has a length equal to the first length as measured in the first direction and a second width as measured in the second direction; and wherein the conductive line is to carry current in the first direction.

Example 13 may include the method of example 12, wherein forming the conductive line includes plating the conductive line.

Example 14 may include the method of example 12, wherein forming the conductive line includes depositing a conductive metal via a planarising process.

Example 15 may include the method of example 14, wherein the planarising process is physical vapor deposition (PVD) or electrochemical deposition (ECD).

Example 16 may include the method of any of examples 12-15, wherein the package is a flip chip ball grid array (fcBGA) package, an embedded wafer level ball grid array (eWLB) package, or a wafer level chip scale package (WLCSP).

Example 17 may include the method of any of examples 12-15, wherein the conductive line is to carry power or data signals.

Example 18 may include the method of any of examples 12-15, wherein the RDL is to expand a chip-scale pitch at a first side of the package to a package-scale pitch at a second side of the package.

Example 19 may include the method of any of examples 12-15, wherein the second width is less than the first width.

Example 20 may include the method of any of examples 12-15, wherein the first portion has a z-height measured perpendicular to the first face of the dielectric layer, and the width of the second portion is less than twice the z-height of the first portion.

What is claimed is:

1. A package comprising:
   a dielectric layer having a first face and a second face opposite the first face; and
   a conductive line of a patterned metal redistribution layer (RDL) coupled with the second face of the dielectric layer, the line including a first portion with a first width as measured in a first direction parallel to the second face and a second portion directly coupled to the first portion, the second portion having a second width as measured in the first direction and wherein the second portion is to reduce ohmic resistance of the line;
   wherein the first portion extends beyond a plane of the second face of the dielectric layer in a second direction perpendicular to the second face and the second portion is positioned between the first face and the second face of the dielectric layer; and
   wherein the line is to carry one or more signals in a third direction perpendicular to the first and second directions.

2. The package of claim 1, wherein the package is a flip chip ball grid array (fcBGA) package.

3. The package of claim 1, wherein the package is an embedded wafer level ball grid array (eWLB) package.

4. The package of claim 1, wherein the package is a wafer level chip scale package (WLCSP).

5. The package of claim 1, wherein the line is to carry one or more power or data signals.

6. The package of claim 1, wherein the RDL is to expand a chip-scale pitch at a first side of the package to a package-scale pitch at a second side of the package.

7. The package of claim 1, wherein the width of the second portion is less than the width of the first portion.

8. The package of claim 7, wherein the first portion has a z-height measured in the second direction, and the width of the second portion is less than twice the z-height of the first portion.

9. The package of claim 1, wherein the line further includes a third portion that is directly coupled to the first portion and adjacent to the second portion.

10. The package of claim 1, wherein the dielectric layer is a first dielectric layer, the line is a first line, and the RDL is a first RDL, and further comprising:
    a second dielectric layer having a first face and a second face opposite the first face, wherein the first face of the second dielectric layer is coupled with the second face of the first dielectric layer; and
    a second line of a second RDL coupled with the second face of the second dielectric layer, the second line including a third portion and a fourth portion, wherein the third portion extends beyond a plane of the second face of the second dielectric layer in the second direction and the fourth portion is positioned between the first face of the second dielectric layer and the second face of the second dielectric layer.

11. A method comprising:
    providing, on a package, a dielectric layer having a first face and a second face opposite the first face;
    forming, in the second face of the dielectric layer, one or more trenches; and
    forming, on the second face of the dielectric layer and in at least one of the one or more trenches, a conductive line of a redistribution layer (RDL), the line including a second portion in the at least one of the one or more trenches and a first portion on the second face of the dielectric layer;
    wherein the first portion has a first length as measured in a first direction parallel to the second face of the dielectric layer and a first width as measured in a second direction parallel to the second face of the dielectric layer and perpendicular to the first direction;
    wherein the second portion has a length equal to the first length as measured in the first direction and a second width as measured in the second direction;
    wherein the conductive line is to carry current in the first direction, and
    wherein the package is a flip chip ball grid array (fcBGA) package, an embedded wafer level ball grid array (eWLB) package, or a wafer level chip scale package (WLCSP).

12. The method of claim 11, wherein forming the conductive line includes plating the conductive line.

13. The method of claim 11, wherein forming the conductive line includes depositing a conductive metal via a planarising process.

14. The method of claim 13, wherein the planarising process is physical vapor deposition (PVD) or electrochemical deposition (ECD).

15. The method of claim 11, wherein the conductive line is to carry power or data signals.

16. The method of claim 11, wherein the RDL is to expand a chip-scale pitch at a first side of the package to a package-scale pitch at a second side of the package.

17. The method of claim 11, wherein the second width is less than the first width.

18. The method of claim 11, wherein the first portion has a z-height measured perpendicular to the first face of the dielectric layer, and the width of the second portion is less than twice the z-height of the first portion.

* * * * *